(12) United States Patent
Nagano

(10) Patent No.: US 7,630,016 B2
(45) Date of Patent: Dec. 8, 2009

(54) IMAGING DEVICE HAVING TRANSPARENT UNIT AND ELECTRONIC APPARATUS

(75) Inventor: Masatoshi Nagano, Ohta-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 641 days.

(21) Appl. No.: 11/140,452

(22) Filed: May 27, 2005

(65) Prior Publication Data

US 2005/0264676 A1   Dec. 1, 2005

(30) Foreign Application Priority Data

May 31, 2004   (JP) .............................. 2004-162508

(51) Int. Cl.
*H04N 5/225* (2006.01)
(52) U.S. Cl. ....................... 348/374; 348/335
(58) Field of Classification Search ................ 348/340, 348/342, 335, 373, 374, 375, 376
See application file for complete search history.

(56) References Cited

U.S. PATENT DOCUMENTS

| | | | |
|---|---|---|---|
| 5,432,208 A * | 7/1995 | Masuhara et al. ............. 522/99 |
| 5,506,401 A | 4/1996 | Segawa | |
| 5,786,589 A | 7/1998 | Segawa | |
| 6,683,298 B1 * | 1/2004 | Hunter et al. ................ 250/239 |
| 6,762,796 B1 * | 7/2004 | Nakajoh et al. ............. 348/340 |
| 6,833,873 B1 | 12/2004 | Suda | |
| 2002/0119658 A1 * | 8/2002 | Honda et al. ................. 438/689 |
| 2002/0154239 A1 * | 10/2002 | Fujimoto et al. ............ 348/340 |
| 2004/0012698 A1 * | 1/2004 | Suda et al. ................... 348/315 |

FOREIGN PATENT DOCUMENTS

| | | |
|---|---|---|
| EP | 1239519 | 9/2002 |
| JP | 2-48801 U1 | 12/1990 |
| JP | 5-100186 A | 4/1993 |
| JP | 7-099214 A | 11/1995 |
| JP | 11-345955 A | 12/1999 |
| JP | 2001-078064 A | 3/2001 |
| JP | 2001-078215 A | 3/2001 |
| JP | 2001-078217 A | 3/2001 |
| JP | 2002-204400 A | 7/2002 |
| JP | 2004-104423 | 4/2004 |

* cited by examiner

*Primary Examiner*—Jason Chan
*Assistant Examiner*—Nicholas G Giles
(74) *Attorney, Agent, or Firm*—Canon USA Inc IP Div

(57) ABSTRACT

An imaging device includes a transparent unit, a holding unit for holding the transparent unit, a photoelectric conversion element for photoelectrically converting a light beam passing through the transparent unit. The transparent unit has a lens member on a first surface and has a diaphragm member on a second surface, the first surface and the second surface being opposite to each other.

2 Claims, 14 Drawing Sheets

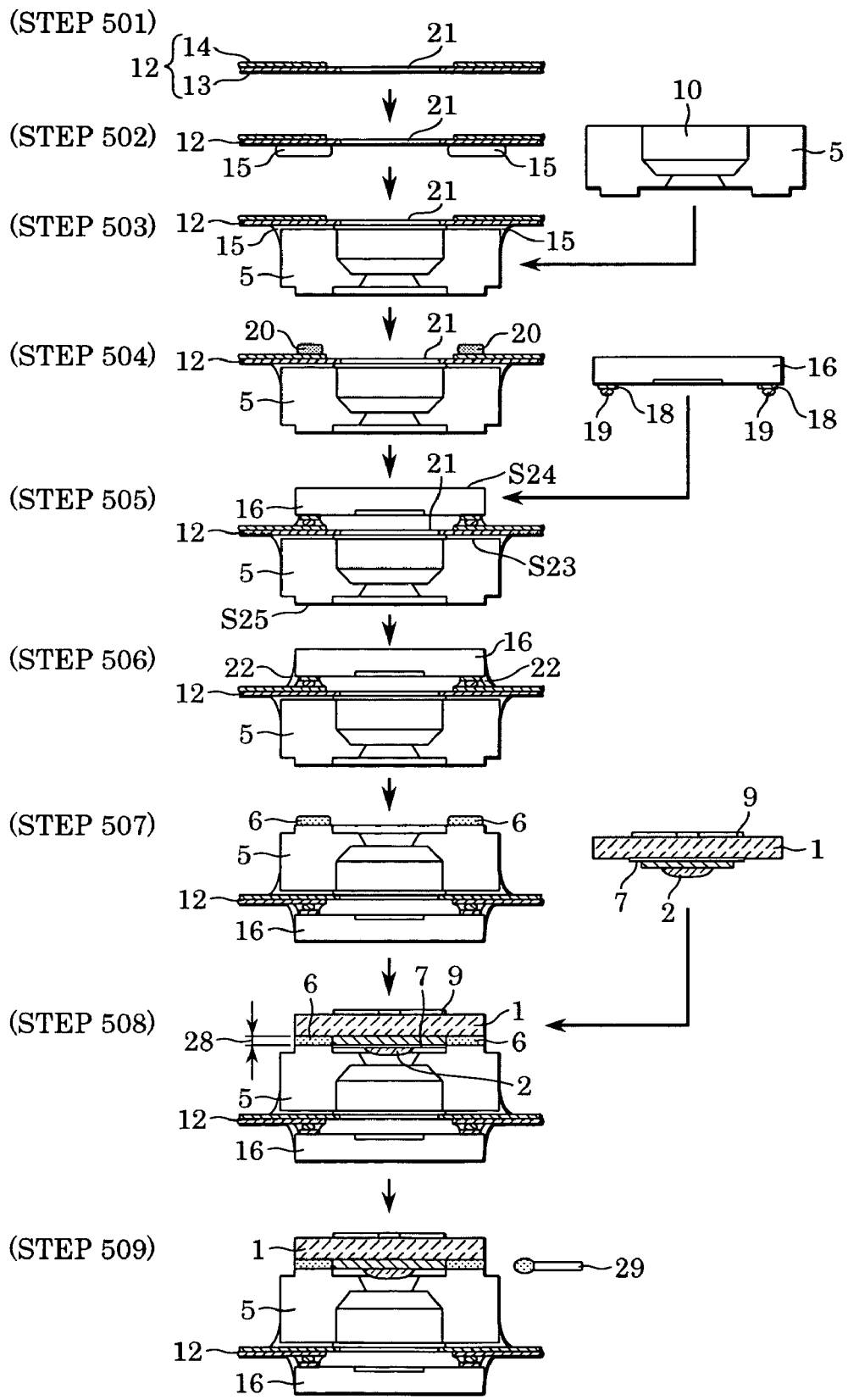

IMAGING DEVICE HAVING TRANSPARENT UNIT AND ELECTRONIC APPARATUS

BACKGROUND OF THE INVENTION

1. Field of the Invention

The present invention relates to imaging devices, and in particular, the present invention relates to a small imaging device installed in an electronic apparatus.

2. Description of the Related Art

Nowadays, small imaging devices in which a photoelectric conversion element, such as a complementary metal oxide semiconductor (CMOS) sensor or a charge coupled device (CCD) sensor, is integrated with a lens are often installed in electronic apparatuses, such as cellular phones or information processing terminals. As electronic apparatuses become miniaturized, imaging devices must be further miniaturized. As a result, packaging of imaging devices including CMOS sensor chips or CCD sensor chips is an important matter.

For example, Japanese Patent No. 3207319 (corresponding to U.S. Pat. Nos. 5,506,401 and 5,786,589) discloses a packaged structure in which a photoelectric conversion element is connected to a wiring board with an anisotropic conductive film by face down bonding and an optical glass disposed on the wiring board so as to be opposite to the photoelectric conversion element. Attaching an imaging lens to a packaged sensor chip having such a packaged structure with a supporting unit realizes an imaging device including an integrated lens.

FIG. 22 shows a typical example of an imaging device including a packaged sensor chip disclosed in Japanese Patent No. 3207319 with an integrated lens. The imaging device includes a packaged sensor chip 120, a barrel 122, and a holding unit 123 for holding the barrel 122. The barrel 122 holds an imaging lens 121 by bonding and includes an opening 125 functioning as a diaphragm. The holding unit 123 is bonded to the packaged sensor chip 120.

The barrel 122 and the holding unit 123 are coupled with a threaded mechanism, so that changing the position of the barrel 122 along the optical axis with respect to the holding unit 123 can adjust the focus of the imaging lens 121 at a photoelectric conversion element 124 of the packaged sensor chip 120. After the focus is adjusted, the barrel 122 is bonded and fixed to the holding unit 123.

However, the imaging apparatus including an integrated lens shown in FIG. 22 has any one of the following disadvantages:

(1) In order to adjust the focus of the imaging lens 121, the barrel 122 and the holding unit 123 are necessary components, thus increasing the number of components and the number of manufacturing steps.

(2) Although the focus of the imaging lens 121 can be adjusted, the inclination of the imaging lens 121 cannot be adjusted. Therefore, image degradation resulting from the inclination of the imaging lens 121 is expected.

(3) If the imaging lens 121 is made of plastic, the imaging lens 121 is very susceptible to environmental changes such that it is very difficult to accurately hold the imaging lens 121. If the imaging lens 121 is a molded glass lens, the cost of manufacture increases.

SUMMARY OF THE INVENTION

The present invention is directed to a compact imaging device having a simple structure and capable of providing high-quality images.

According to one aspect of the present invention, an imaging device includes a transparent unit, a holding unit holding the transparent unit, a photoelectric conversion element configured to photoelectrically convert a light beam passing through the transparent unit. The transparent unit has a lens member on a first surface and has a diaphragm member on a second surface, the first surface and the second surface being opposite to each other.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 7 shows the steps for manufacturing the imaging device according to the first embodiment.

DESCRIPTION OF THE EMBODIMENTS

The embodiments of the present invention are described below with reference to the drawings.

First Embodiment

Figure 1:
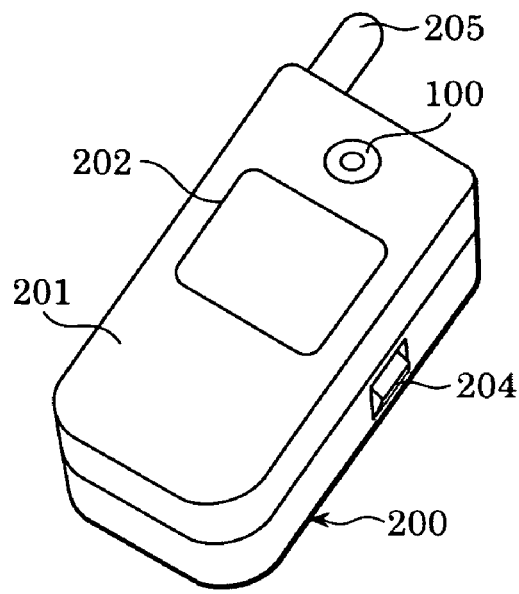
FIG. 1 is an external view of an electronic apparatus to which an imaging device according to an embodiment of the present invention is incorporated.

Referring to FIG. 1, a portable electronic apparatus (cellular phone) incorporating an imaging device according to this embodiment is described below. FIG. 1 is a perspective view of the cellular phone. A body 200 includes a power switch 204 for switching the power on and off by the press of a button. A display unit 201 includes a display screen 202 and is rotatably attached to the body 200. The display unit 201 includes an antenna 205 for communication with a communication device (not shown). An imaging device 100 is incorporated in the display unit 201 and is driven by turning the power on by the press of the power switch 204.

During an image capturing operation, an image of a subject is formed on an image plane of an imaging element constituting the imaging device 100. The image of the subject outputted from the imaging element is displayed on the display screen 202.

Figure 2:
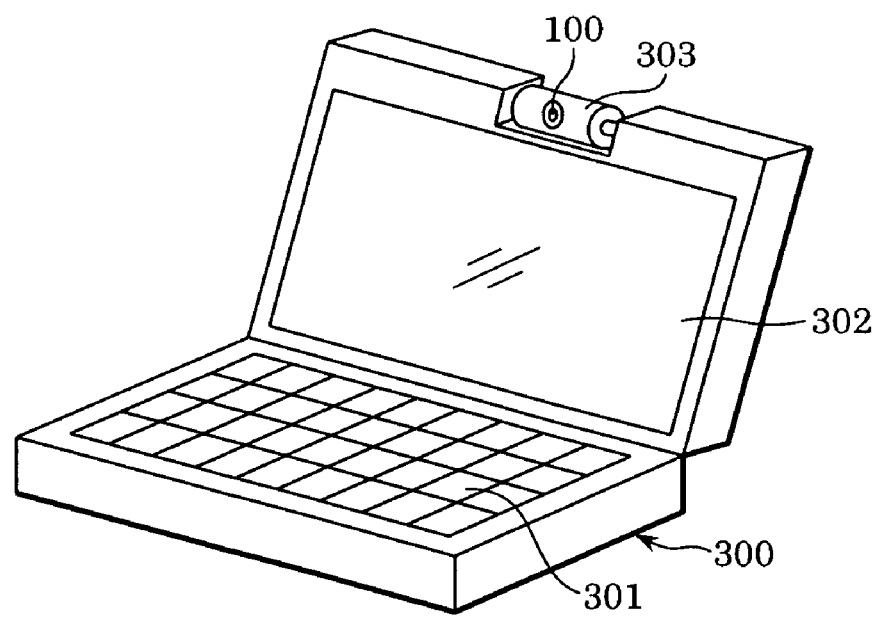
FIG. 2 is an external view of another electronic apparatus to which the imaging device according to an embodiment of the present invention is incorporated.

The imaging device according to this embodiment is applicable to other electronic apparatuses, such as a personal computer (PC). FIG. 2 is a perspective view of a notebook PC to which the imaging device according to this embodiment is incorporated.

An operational unit (keyboard) 301 and a liquid crystal display unit 302 are attached to a body 300. The imaging device 100 is disposed in a rotatable unit 303 attached to the upper portion of the liquid crystal display unit 302. The rotatable unit 303 allows the imaging device 100 to freely change the direction of capture, so that a user can easily capture an image of himself or herself with the imaging device 100.

Therefore, the imaging device 100 can capture an image by the operation of the operational unit 301, an image of a subject captured by the imaging device 100 can be displayed on the liquid crystal display unit 302, and a user can edit the captured image by operating the operational unit (keyboard) 301. If the PC is connected to the Internet, a captured image can be sent over the Internet. An image may be captured by the operation of an external operational unit that can be controlled remotely.

The rotatable unit 303 may be used in the electronic apparatus shown in FIG. 1 such that the direction of capture can be changed. The functions and structures added to the imaging device 100 are not limited to those described above. The present invention is applicable to a personal digital assistant (PDA), a fixed electronic apparatus, and the like. The imaging device 100 according to this embodiment is described below.

Figure 3:
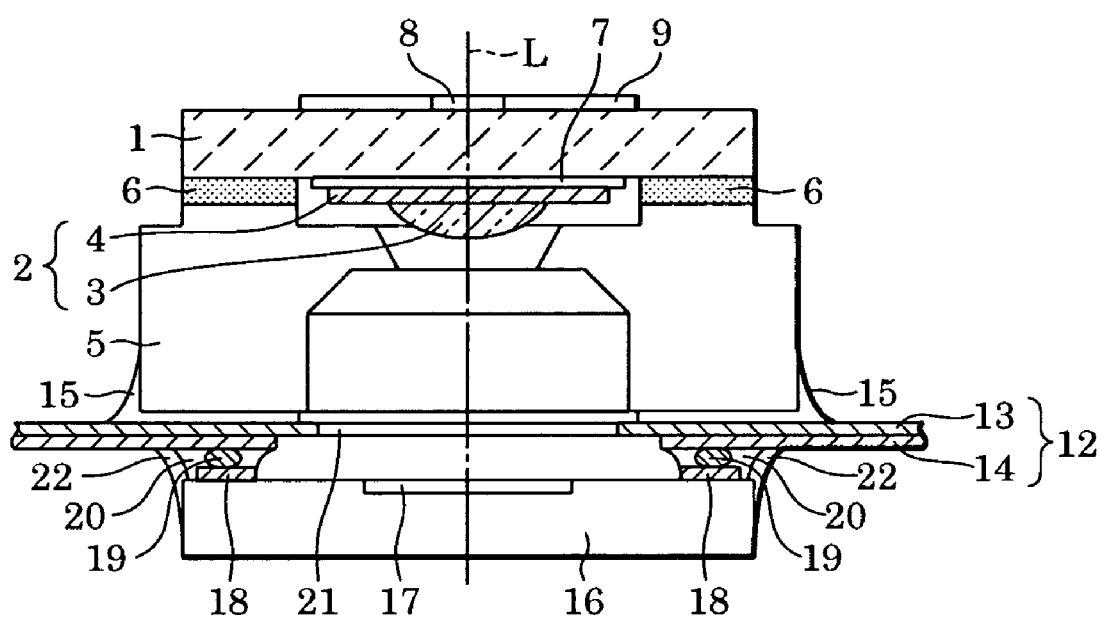
FIG. 3 is a schematic vertical sectional view of an imaging device according to a first embodiment of the present invention.

FIG. 3 is a schematic vertical sectional view of the imaging device 100 according to the first embodiment of the present invention.

A transparent unit 1 is a flat glass substrate made of an optical glass. A lens member 2 is composed of an aspheric portion 3 and a base 4. The lens member 2 has an optical axis L. The lens member 2 can be readily formed by replica molding or the like. In this case, the lens member 2 is commonly molded of photocurable acrylic resin or photocurable epoxy resin.

The transparent unit 1 with the lens member 2 is bonded to and held by a holding unit 5 with an adhesive layer 6 therebetween. An infrared cutoff filter (layer) 7 is formed on the transparent unit 1 by multilayer coating. The lens member 2 is formed on the infrared cutoff filter 7.

In order to allow visible light beams to efficiently pass through, the infrared cutoff filter 7 is set such that a cutoff wavelength for defining the transmission of a filter so as to transmit visible light and to block near-infrared light is about 690 nm. If the cutoff wavelength is set at 670 nm, as disclosed in Japanese Patent Laid-Open Nos. 2001-078215 and 2001-078217 (corresponding to U.S. Pat. No. 6,833,873), a component of light beams entering the infrared cutoff filter 7 in a slanting direction at and below 670 nm is significantly blocked. Therefore, the color at the outer region of a captured-image screen becomes bluish as compared with the color at the center of the screen. Accordingly, the cutoff wavelength of this embodiment has an allowance on the order of 40 nm above 650 nm. (In consideration of the accuracy of wavelengths, light components below 670 nm are blocked.) Since deviation from the cutoff wavelength reduces efficiency, the accuracy of the cutoff wavelength is set at ±20 nm in this embodiment, and can be set in a range of 670 nm±20 nm in order to suppress the reduction in efficiency to within this limit.

On the top surface of the transparent unit 1, a diaphragm member (a first diaphragm layer) 9 including a circular opening 8 is disposed. The first diaphragm layer 9 can be integrally formed on the transparent unit 1 by printing. If a photolithographic process (vapor deposition) used in manufacturing a black matrix of a liquid crystal panel is employed, an opening can be formed with higher accuracy. The infrared cutoff filter 7 is positioned in a region where a beam passing from the opening 8 of the first diaphragm layer 9 passes therethrough.

A flexible wiring board (electrical wiring board) 12 is composed of an insulating sheet 13 functioning as a base and a copper foil pattern 14. The insulating sheet 13 can be a composite substrate of glass or paper base and resin selected from the group consisting of polyimide, polyamide, and polyester, or resin of phenol and/or glass-reinforced epoxy.

The flexible wiring board 12 is bonded and fixed to the holding unit 5 with an adhesive layer 15. An imaging sensor chip (photoelectric conversion element) 16 has a light-receiving area 17. Electrode pads 18 are disposed on the outer region of the imaging sensor chip 16, and gold bumps 19 are disposed on the electrode pads 18. The imaging sensor chip 16 is electrically connected to the flexible wiring board 12 with an anisotropic conductive paste portion 20.

A sealing portion 22 seals the outer region of the imaging sensor chip 16 to prevent a surface of the imaging sensor chip 16 from being exposed to air so that the surface of the imaging sensor chip 16 is not degraded. In this embodiment, in addition to blocking air by the anisotropic conductive paste portion 20, sealing by the sealing portion 22 is used in order to make hermeticity more reliable. The adhesive layers 6 and 15 also function to block air from entering an imaging module. As a result, the imaging module is completely sealed.

Figure 4A:
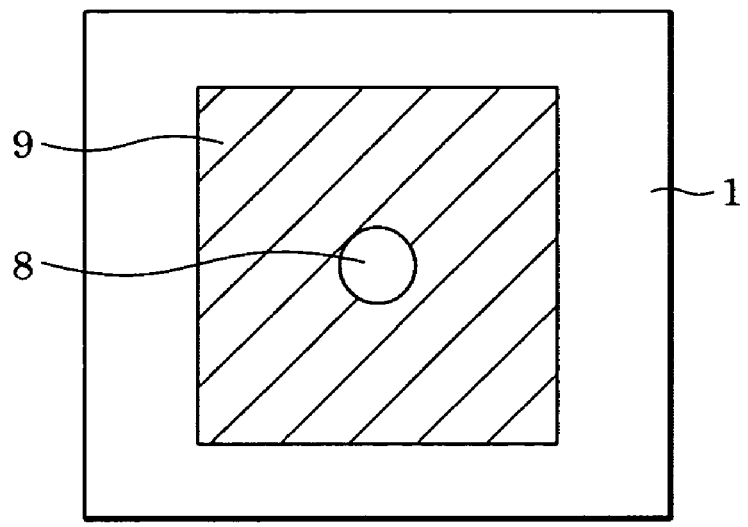
FIG. 4A is a top view of a transparent unit of the imaging device according to the first embodiment.
Figure 4B:
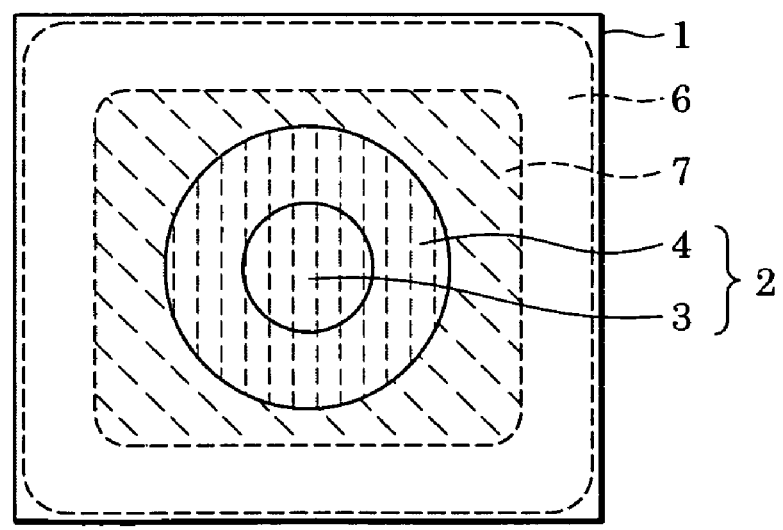
FIG. 4B is a bottom view of the transparent unit.

FIG. 4A is a top view of the transparent unit 1, the lens member 2, the infrared cutoff filter 7, and the first diaphragm layer 9, and FIG. 4B is a bottom view thereof. FIG. 4B shows a state in which the aspheric portion 3 and the base 4 of the lens member 2 are formed such that they exhibit substantially circular forms in cross section and are disposed in the central region of the transparent unit 1. An area enclosed with dotted lines (a second area) is an adhesive interface between the adhesive layer 6 and the transparent unit 1 shown in FIG. 3 and has a ring shape surrounding the lens member 2. The adhesive layer 6 does not contact the lens member 2 in order to avoid the lens member 2 from being subjected to stress induced by contraction or expansion of the adhesive layer 6 with environmental changes.

The infrared cutoff filter 7 is not present in the adhesive interface between the adhesive layer 6 and the transparent unit 1, and the first diaphragm layer 9 is not formed in an area corresponding to the adhesive interface (second area) on the top surface of the transparent unit 1. The reason is to facilitate an assembly operation of the imaging device 100 by curing an ultraviolet curing adhesive used as the adhesive layer 6 in a short period of time, as described below. If the infrared cutoff filter 7, through which it is difficult to transmit ultraviolet light beams, and the first diaphragm layer 9, through which ultraviolet light beams do not pass, were formed in the area corresponding to the second area, the adhesive layer 6 would not be cured properly.

Figure 5:
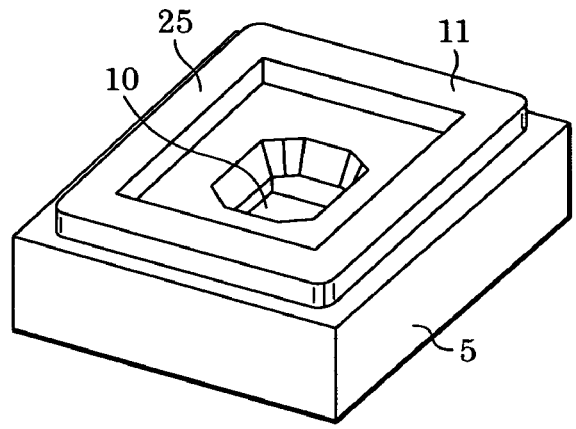
FIG. 5 is a perspective view of a holding unit of the imaging device according to the first embodiment.

FIG. 5 is a perspective view of the holding unit 5. The holding unit 5 has a through hole 10 in the central region so that the light passing from the lens member 2 continues therethrough. As shown in FIG. 3, the through hole 10 tapers down towards the region remote from the lens member 2 so as to form a knife-edge in order to minimize ghosting and flare.

A ring-like protrusion 11 is disposed on the top surface of the holding unit 5. The adhesive layer 6 is formed on the protrusion 11, and the width of the adhesive layer 6 is limited to the width of the protrusion 11, so that the adhesive layer 6 is not in contact with the lens member 2, as shown in FIG. 4B.

Bonding the flexible wiring board 12 and the imaging sensor chip 16 together is described below with reference to FIGS. 6A and 6B.

Figure 6A:
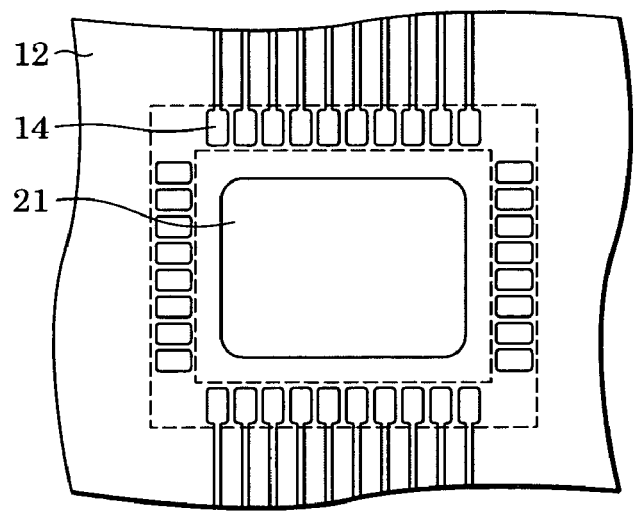
FIG. 6A is a bottom view of an electrical wiring board of the imaging device shown in FIG. 3.
Figure 6B:
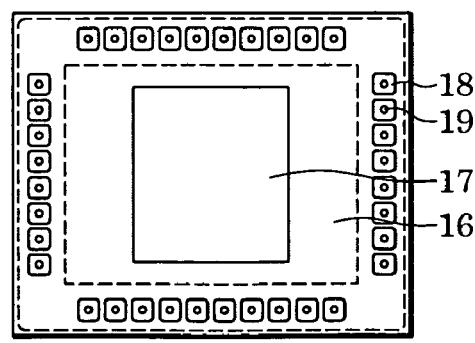
FIG. 6B is a top view of a photoelectric conversion element of the imaging device shown in FIG. 3.

FIG. 6A shows the flexible wiring board 12 viewed from the bottom of FIG. 3, and FIG. 6B shows the imaging sensor chip 16 viewed from the top of FIG. 3. The light-receiving area 17 of the imaging sensor chip 16 includes many pixel units, and each pixel unit includes a color filter, a microlens, and a light-receiving section. The color filter includes one red pass filter, one blue pass filter, and two green pass filters arranged in a Bayer pattern (not shown). In FIGS. 6A and 6B, the flexible wiring board 12 includes an opening 21 in the center so that the light from the lens member 2 continues therethrough. A plurality of copper foil patterns 14 is disposed on the flexible wiring board 12 in the vicinity of the four sides of the opening 21.

A plurality of electrode pads 18 corresponding to the copper foil patterns 14 is disposed on the imaging sensor chip 16. The electrode pads 18 have individual gold bumps 19 thereon. The copper foil patterns 14 and the gold bumps 19 are aligned and are electrically connected to each other with the anisotropic conductive paste portion 20 therebetween. Although only the upper and lower sides of the flexible wiring board 12 have the copper foil patterns 14 actually wired, the right and left sides of the flexible wiring board 12 have the copper foil patterns 14 as dummies and corresponding electrode pads. This improves reliability of electrical connection between the flexible wiring board 12 and the imaging sensor chip 16.

In FIGS. 6A and 6B, the anisotropic conductive paste portion 20 is present in an area enclosed with dotted lines (see FIG. 3), and this area covers the junctions of the copper foil patterns 14 and the periphery of the electrode pads 18. Therefore, the anisotropic conductive paste portion 20 electrically connects between the copper foil patterns 14 and the gold bumps 19 and also bridges gaps between the gold bumps 19 electrically connected, so that the anisotropic conductive paste portion 20 serves to prevent air from entering the inside.

The process of manufacturing the imaging module is described below with reference to FIG. 7. In this embodiment, a 'face down' manufacturing method, in which the imaging device 100 shown in FIG. 3 is produced in an inverted orientation, is used.

FIG. 7 shows the process of manufacturing the imaging device 100 shown in FIG. 3. In step 501, the copper foil patterns 14 are formed on the insulating sheet 13 by etching or the like.

In step 502, the adhesive layer 15 is set on a surface of the flexible wiring board 12 using screen printing or the like, the surface being where the copper foil patterns 14 of the flexible wiring board 12 formed in step 501 are not present.

In step 503, the holding unit 5 and the flexible wiring board 12 are bonded to each other with the adhesive layer 15. In step 503, an ultraviolet-curing and thermosetting adhesive is used as the adhesive layer 15, and the adhesive layer 15 extruding into the opening 21 of the flexible wiring board 12 when the holding unit 5 is pressed against the flexible wiring board 12 is irradiated with ultraviolet rays through the through hole 10 and the opening 21 in the vertical direction, thus preventing the adhesive layer 15 from further extruding into the opening 21.

In addition, complete curing of the adhesive layer 15 can be realized by maintaining this arrangement under high temperature conditions in a predetermined period of time. Since the holding unit 5 is bonded to the flexible wiring board 12 while being pressed, the thickness of the adhesive layer 15 existing between the holding unit 5 and the flexible wiring board 12 is on the order of several micrometers.

In step 504, the anisotropic conductive paste portion 20 is set on the flexible wiring board 12 using screen printing or the like. As an alternative to the anisotropic conductive paste portion 20, a frame-shaped anisotropic conductive film may be placed on the flexible wiring board 12.

In step 505, the flexible wiring board 12 and the imaging sensor chip 16 with the gold bumps 19 are connected with the anisotropic conductive paste portion 20 therebetween in such a way that the gold bumps 19 and the junctions of the copper foil patterns 14 of the flexible wiring board 12 are aligned.

The connection with the anisotropic conductive paste portion 20 is performed by the application of heat and pressure. An area overlapping the region where the anisotropic conductive paste portion 20 is set on a surface s23 of the holding unit 5 is flat, the surface s23 being adjacent to the flexible wiring board 12.

Therefore, the surface s23 is flat except for the through hole 10. In addition, since a back surface s24 of the imaging sensor chip 16 and a surface s25 of the holding unit 5, the surface s25 being where the transparent unit 1 is to be placed, are pressed with a jig or the like during the application of pressure, it is necessary that the surface s25 of the holding unit 5 have some flat area.

In this embodiment, a top surface 25 of the protrusion 11 shown in FIG. 5 corresponds to the required flat area. With respect to a face perpendicular to the optical axis L, the top surface 25 and an area where the anisotropic conductive paste portion 20 is set substantially overlapped with one another. Therefore, distortion of the holding unit 5 created when pressure is applied can be reduced, thus enhancing yields for connection with the anisotropic conductive paste portion 20. The anisotropic conductive paste portion 20 can be an epoxy resin in which gold particles having a diameter on the order of 1 μm to 10 μm are dispersed in such a way that the gold particles account for 3% to 30% by volume.

In step 506, the sealing portion 22 is set so as to cover the anisotropic conductive paste portion 20, and is cured by the application of heat and/or ultraviolet rays. After the flexible wiring board 12 and the imaging sensor chip 16 are connected with the anisotropic conductive paste portion 20, the transparent unit 1 and the flexible wiring board 12 may be bonded to each other with the adhesive layer 15.

Figure 8:
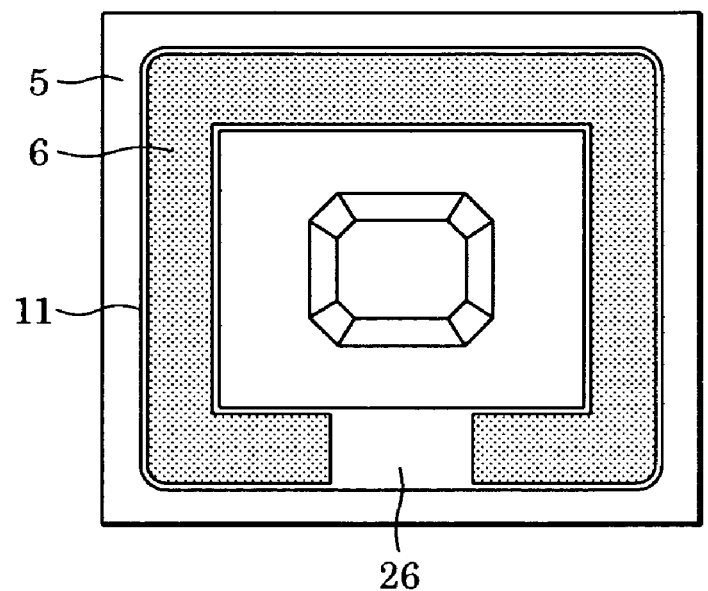
FIG. 8 is an illustration for explaining the steps shown in FIG. 7.

In step 507, the imaging device is inverted, and the adhesive layer 6 is applied to the protrusion 11 of the holding unit 5. FIG. 8 shows the holding unit 5 when the adhesive layer 6 is applied to the top of the protrusion 11, and corresponds to a top view of the imaging device in step 507 of FIG. 7. The adhesive layer 6 is applied using screen printing method, a dispenser method, or the like. The adhesive layer 6 is aligned with the protrusion 11 having a ring-like shape. At this time, a gap 26 is formed in the adhesive layer 6.

The reason why the gap 26 is formed is the following. In a process of bonding the transparent unit 1, as in step 508 described below, if the gap 26 was not present, air inside the sealed imaging device 100 would not escape. Under these circumstances, when the air is expanded due to a temperature change, the adhesive layer 6 may break at an unexpected section so that the air may escape from the broken section. An ultraviolet curing epoxy adhesive can be used as the adhesive layer 6.

In step 508, the transparent unit 1 and the holding unit 5 are bonded to each other. The lens member 2, the infrared cutoff filter 7, and the first diaphragm layer 9 are already formed on the transparent unit 1. The transparent unit 1 is subjected to chucking with a jig or the like, and the focus and inclination of the lens member 2 are then adjusted. After the transparent unit 1 is positioned, the adhesive layer 6 is cured by irradiation with ultraviolet rays from a surface of the transparent unit 1, the surface being where the first diaphragm layer 9 is formed (second surface). After cure of the adhesive layer 6 is completed, chucking with the jig is released.

At this time, since the first diaphragm layer 9 or the infrared cutoff filter 7 is not present in an area through which the ultraviolet rays pass on a top face or bottom face, the ultraviolet rays from the surface where the first diaphragm layer 9 is formed (second surface) pass through the transparent unit 1 without significant attenuation and cure the adhesive layer 6. The thickness of the adhesive layer 6 can be a minimum value allowing the adjustments described above to be performed and considering dimensional tolerances of components and assembly tolerances. The reason is to maintain the relative positions between the lens member 2 and the imaging sensor chip 16 even when the adhesive layer 6 contracts or expands due to environmental changes. The adhesive layer 6 is varied widely, compared with other components.

The focus and inclination of the lens member 2 can be easily adjusted by forming an image of a predetermined chart on the imaging sensor chip 16 through the lens member 2 and reading an image signal of the imaging sensor chip 16. As of step 508, the flexible wiring board 12 is electrically connected to the imaging sensor chip 16, and therefore, the image signal can be read through the flexible wiring board 12.

The adjustment of the focus and inclination of the lens member 2 is performed when the adhesive layer 6 that is not cured is present between the transparent unit 1 and the holding unit 5. Since the transparent unit 1 is required to be moved, although minutely, in this state, the viscosity and wettability of the adhesive layer 6 is important. In general, the viscosity of adhesives can be easily changed by changing the content or the type of filler. Therefore, the adhesive layer 6 can be optimized in accordance with the characteristics of the transparent unit 1 and the holding unit 5, which serve as adherends.

In step 509, the gap 26 (shown in FIG. 8) of the adhesive layer 6 is sealed, and the assembly of the imaging device 100 is completed. In this sealing process, a sealant is applied to a side through a nozzle 29 of a dispenser adjacently disposed to the imaging device 100, as shown in FIG. 7. The thickness 28 of the adhesive layer 6 (clearance of the gap 26) is minute, so that an adhesive can readily enter into the inside using a capillary phenomenon. The adhesive used in this sealing process may be the same as the material of the adhesive layer 6.

Figure 9:
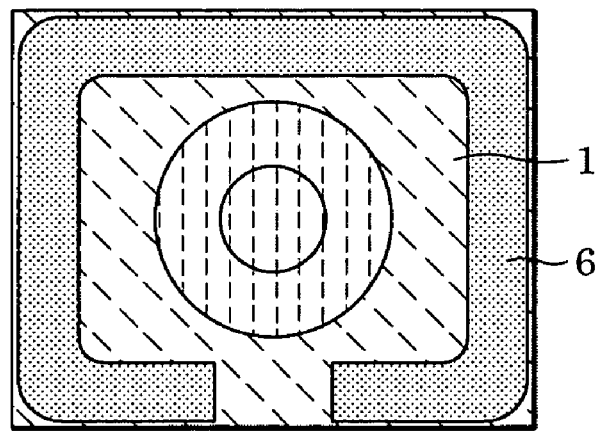
FIG. 9 is an illustration for explaining of another step in the manufacturing steps shown in FIG. 7.

The process of manufacture described above is carried out in a clean room, since the imaging sensor chip 16 is a semiconductor component. In steps 507 to 509 in the process of manufacture above, the face down manufacturing method, in which the imaging device 100 is produced in an inverted orientation, is not employed. However, if the adhesive layer 6 is applied to the transparent unit 1, as shown in FIG. 9, the face down manufacturing method can be used.

Figure 10:
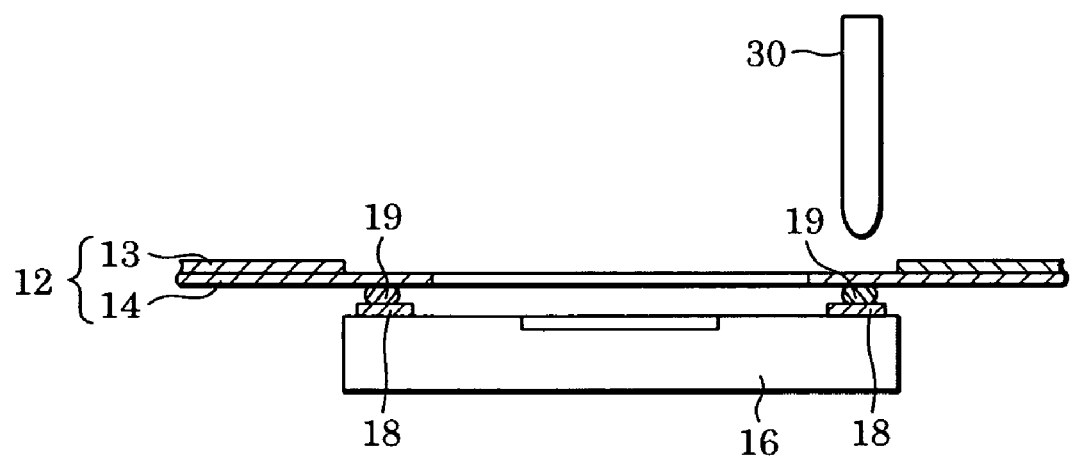
FIG. 10 shows a step for electrical connection.

In this embodiment, the anisotropic conductive paste portion 20 is used for electrically connecting the flexible wiring board 12 and the imaging sensor chip 16. However, as shown in FIG. 10, the electrical connection between the copper foil patterns 14 on the flexible wiring board 12 and the gold bumps 19 on the electrode pads 18 may be performed by thermosonic bonding using a small heater tool 30 for bonding on a pin-by-pin basis.

In this case, in the steps shown in FIG. 7, the assembly operation of the holding unit 5 and that of the imaging sensor chip 16 change places. In addition, the gaps between the gold bumps 19 are filled with the sealing portion 22. The flexible wiring board 12 has a structure in which the copper foil patterns 14 projects in the opening 21 more than the insulating sheet 13, i.e., a lead frame structure. Therefore, for bonding and fixing the holding unit 5 and the flexible wiring board 12, it is necessary to use an insulating material as the holding unit 5. If even a little conductive material is used, measures for preventing the copper foil patterns 14 and the holding unit 5 from coming into contact with each other, such as arranging an additional insulating sheet on the holding unit 5 at a surface adjacent to the flexible wiring board 12, must be taken. However, this method has advantage. The face down manufacturing process is not required. In addition, since tact time required to connect one pin is only a few seconds, in the case when the number of electrode pads is small, this method can have a shorter overall tact time than the use of the anisotropic conductive paste portion 20.

As described above, miniaturization and structure simplification of the imaging device 100 are realized. Moreover, the imaging device 100 with excellent features in term of cost and environment is realized.

Specifically, since the lens member 2 is disposed on the transparent unit 1, the length of the optical system can be reduced, thus realizing the miniaturization.

Furthermore, since the transparent unit 1 with the lens member 2 and the holding unit 5 are bonded to each other with a photocurable adhesive, the focus and inclination of the lens member 2 can be readily adjusted using the adhesive layer 6 that is not cured and is present between the transparent unit 1 and the holding unit 5, and the adhesive layer 6 can be readily cured by irradiation with ultraviolet rays after the completion of the adjustment. In addition, the number of components is not increased even when such an adjustment is included in the manufacture process.

Unlike near-infrared cutoff units disclosed in Japanese Patent Laid-Open Nos. 5-100186, 2001-078064, and 11-345955, the infrared cutoff filter 7 in this embodiment is partly present on the surface. The infrared cutoff filter 7 is not present in an adhesive interface area (second area) between the adhesive layer 6 and the transparent unit 1, and the first diaphragm layer 9 is not present in an area corresponding to the second area on the top surface of the transparent unit 1 (the first diaphragm layer 9 is present in a third area on the top surface of the transparent unit 1, the third area corresponding a first area where the lens member 2 is disposed). Therefore, irradiation with ultraviolet rays can be easily performed on the photocurable adhesive layer 6. Moreover, unlike a film functioning as a filter disclosed in Japanese Patent Laid-Open No. 2002-204400, the infrared cutoff filter 7 is not disposed on a curved surface of the lens. Therefore, a uniform filter layer can be easily formed, thus leading to improvements in productivity.

The transparent unit 1 made of optical glass functions as a base of the lens member 2 made of resin. Therefore, since the volume ratio between the transparent unit 1 and the lens member 2 is large, the coefficient of linear expansion of the transparent unit 1 is dominant. As a result, even when environmental changes occur, the position of the lens member 2 and the shape of the aspheric portion 3 are maintained with high accuracy.

Second Embodiment

In the second embodiment, the imaging device including a multiple-lens system is described. This imaging device includes optical systems corresponding to individual specific colors and creates a color image by combining captured images corresponding to respective colors. The imaging device according to this embodiment has advantages in that the focal length is about half the length of a normal optical system. As a result, a smaller imaging device can be realized using this embodiment.

In this embodiment, the components having the same functions as those in the first embodiment have the same reference numerals, and similar structures are described with reference to the drawings in the first embodiment.

Figure 11:
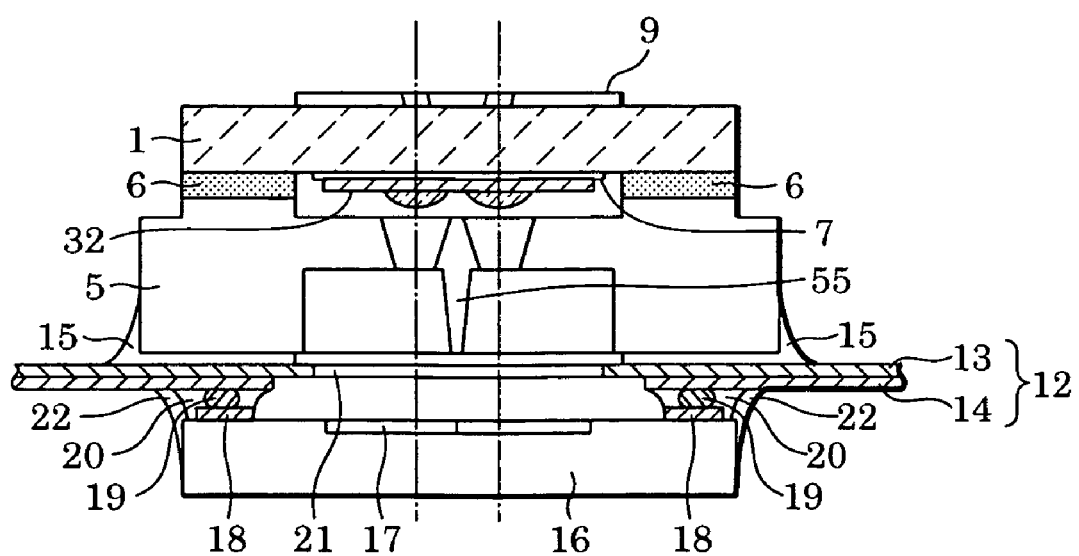
FIG. 11 is a schematic vertical sectional view of the imaging device according to a second embodiment.

FIG. 11 is a schematic vertical sectional view of the imaging device according to the second embodiment. A lens member 32 including four lens elements is disposed on the transparent unit 1. Each lens element forms an image corresponding to individual specific colors. In FIG. 11, only two of the four lens elements are shown.

Figure 12A:
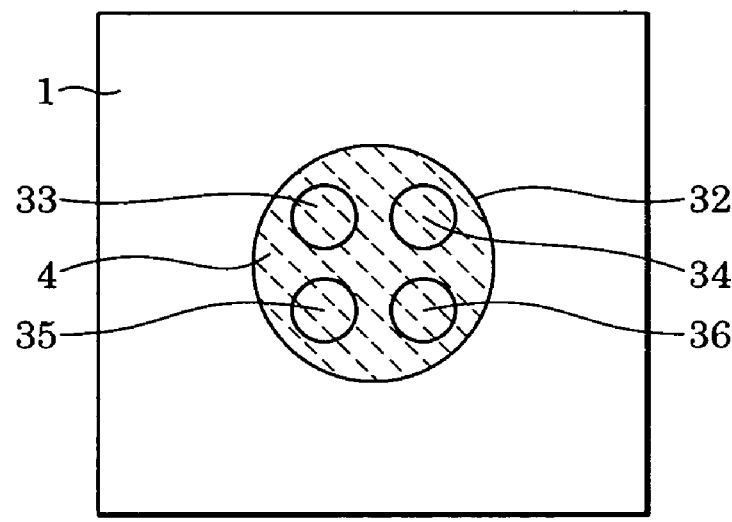
FIG. 12A is a bottom view of a transparent unit of the imaging device according to the second embodiment.

FIG. 12A is a bottom view of the transparent unit 1. The lens member 32 including four aspheric portions 33, 34, 35, and 36 functioning as the four lens elements is attached to the bottom of the transparent unit 1. For example, the aspheric portion 33 corresponds to red, the aspheric portions 34 and 35 correspond to green, and the aspheric portion 36 corresponds to blue. All these aspheric portions are optimized corresponding to wavelengths of respective colors.

The first diaphragm layer 9 is disposed on the top surface of the transparent unit 1. The first diaphragm layer 9 includes four openings (diaphragm openings) 38, 39, 40, and 41. Color filters 42, 43, 44, and 45 are attached to the four diaphragm openings 38, 39, 40, and 41, respectively. The four color filters 42, 43, 44, and 45 individually correspond to the lens elements of the lens member 32. The infrared cutoff filter 7 is disposed between the bottom surface of the transparent unit 1 and the lens member 32. It is necessary that the infrared cutoff filter 7 be positioned in a region through which at least a beam passing from the first diaphragm layer 9 passes.

As is the case with the first embodiment, the infrared cutoff filter 7 is not present in an adhesive interface between the adhesive layer 6 and the transparent unit 1, and the first diaphragm layer 9 is not present in an area corresponding to the adhesive interface on the top surface of the transparent unit 1.

Figure 12B:
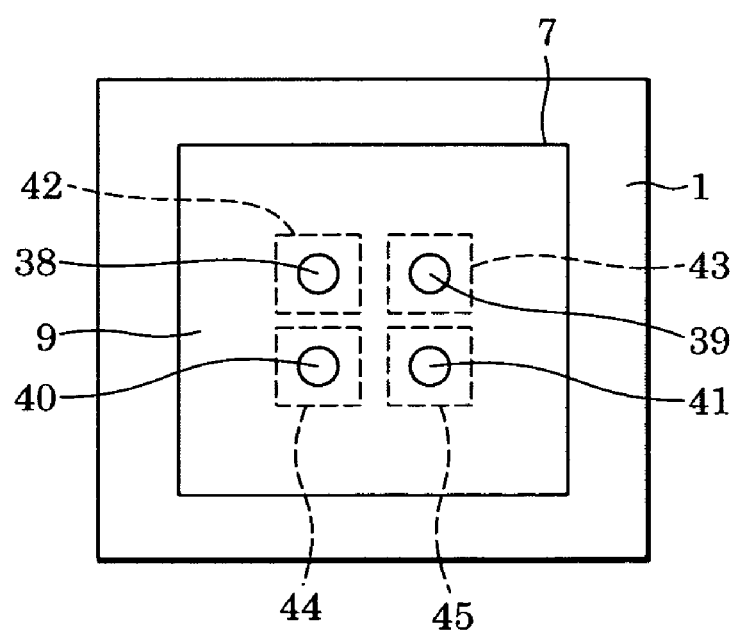
FIG. 12B is a top view of the transparent unit.

FIG. 12B is a top view of the transparent unit 1 and shows the arrangement of the four diaphragm openings 38, 39, 40, and 41 of the first diaphragm layer 9. The four diaphragm openings 38, 39, 40, and 41 correspond to the four lens elements included in the lens member 32. The color filters 42, 43, 44, and 45 are attached to the four diaphragm openings 38, 39, 40, and 41, respectively. The aspheric portion 33 corresponds to the diaphragm opening 39 and the color filter 43, the aspheric portion 34 corresponds to the diaphragm opening 38 and the color filter 42, the aspheric portion 35 corresponds to the diaphragm opening 41 and the color filter 45, and the aspheric portion 36 corresponds to the diaphragm opening 40 and the color filter 44.

In this embodiment, the color filters 42, 43, 44, and 45 are disposed adjacent to the transparent unit 1. Therefore, color filters disposed below the microlenses of the imaging sensor chip 16 are not necessary. This can reduce the distance between the microlenses and the light-receiving area, thus expanding a light-collecting area of the microlenses.

The color filters 42, 43, 44, and 45 can be readily produced using a photolithographic method (vapor deposition) used in manufacture of a color filter of a CCD. The color filters 42, 43, 44, and 45 can be produced by alternative methods, such as printing.

In this embodiment, the first diaphragm layer 9 and the color filters 42, 43, 44, and 45 are disposed on the top surface of the transparent unit 1, and the infrared cutoff filter 7 is disposed on the bottom surface of the transparent unit 1. However, the positions of these components are not limited to this. For example, the infrared cutoff filter 7 may be disposed on the top surface of the transparent unit 1, as well as the first diaphragm layer 9 and the color filters 42, 43, 44, and 45. The order of these components may be changed.

Figure 13:
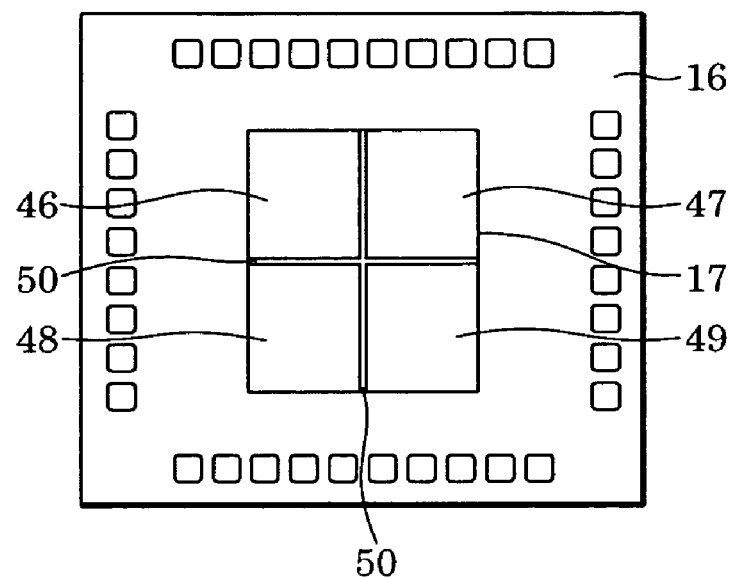
FIG. 13 is a top view of the photoelectric conversion element of the imaging device according to the second embodiment.

FIG. 13 is a top view of the imaging sensor chip 16 according to this embodiment. The light-receiving area 17 includes four light-receiving sections 46, 47, 48, and 49 individually corresponding to the four lens elements of the lens member 32. Each light-receiving section is separated by a slight gap section 50 from the adjacent sections. The aspheric portion 33 corresponds to the light-receiving section 47, the aspheric portion 34 corresponds to the light-receiving section 46, the aspheric portion 35 corresponds to the light-receiving section 49, and the aspheric portion 36 corresponds to the light-receiving section 48.

Figure 14:
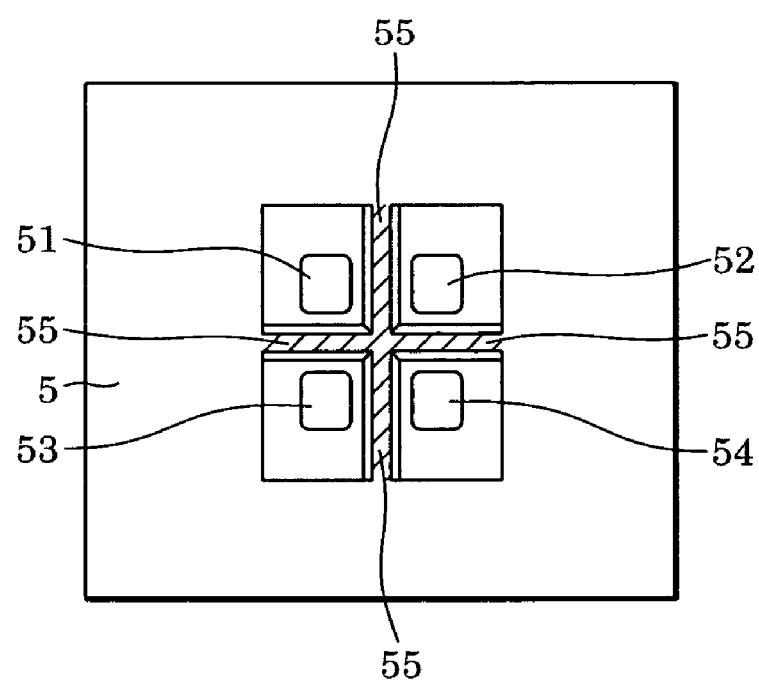
FIG. 14 is a bottom view of the holding unit of the imaging device according to the second embodiment.

FIG. 14 is a bottom view of the holding unit 5. The holding unit 5 includes four through holes 51, 52, 53, and 54 individually corresponding to the four lens elements of the lens member 32. As shown in FIG. 11, the four through holes are divided from each other by thin walls 55 therebetween. The walls 55 serve to prevent a light beam passing through, for example, the aspheric portion 33 of the lens member 32 from leaking into the adjacent light-receiving sections 46 and 49, i.e., to avoid optical crosstalk. The base area (shaded area in FIG. 14) of the walls 55 corresponds to the gap section 50 of the imaging sensor chip 16.

As shown in FIG. 11, the walls 55 are composed of two tapered sections, i.e., the upper tapered section and the lower tapered section, in order to prevent ghosting, flare, and optical crosstalk and to maintain mechanical strength.

As a result, the imaging device has the advantages of the first embodiment. The process of manufacturing the imaging device is the same as that in the first embodiment, and therefore, it is not repeated here.

In this embodiment, the flexible wiring board 12 and the imaging sensor chip 16 produced by the step shown in FIG. 10 may be employed.

Third Embodiment

In the third embodiment, a dustproof glass (additional transparent unit) for packaging, as shown in a known imaging device, is added to the imaging module in the first embodiment. According to this embodiment, some steps in manufacture can be performed under normal conditions. In other words, the entire manufacturing steps can be divided into two processes, i.e., a first process in a clean room and a second process under normal conditions. As a result, steps in a clean room requiring a significant capital investment can be reduced.

In this embodiment, the components having the same functions as those in the first and second embodiments have the same reference numerals, and similar structures are described with reference to the drawings in the first and second embodiments.

Figure 15:
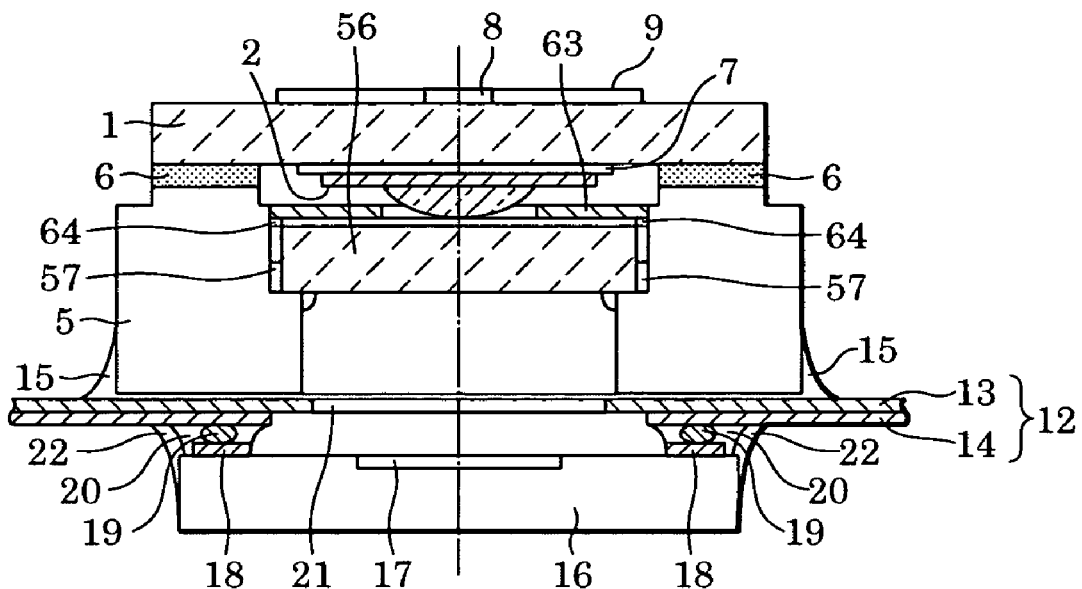
FIG. 15 is a schematic vertical sectional view of the imaging device according to a third embodiment.

FIG. 15 is a schematic vertical sectional view of the imaging device according to the third embodiment. The holding unit 5 holds a dustproof glass (additional transparent unit) 56 for preventing the imaging sensor chip 16 from being covered with dust. The dustproof glass 56 is bonded and fixed with adhesive portions 57.

Figure 16:
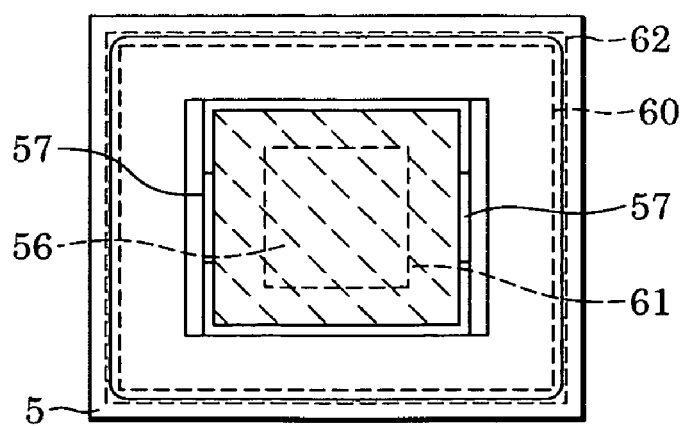
FIG. 16 is a top view of the holding unit and a dustproof glass incorporated therein.

FIG. 16 is a top view of the holding unit 5 and the dustproof glass 56 incorporated therein. The dustproof glass 56 is secured at two points with the adhesive portions 57. The adhesive portions 57 can employ a slight amount of an ultraviolet curing adhesive or thermosetting adhesive.

Figure 17:
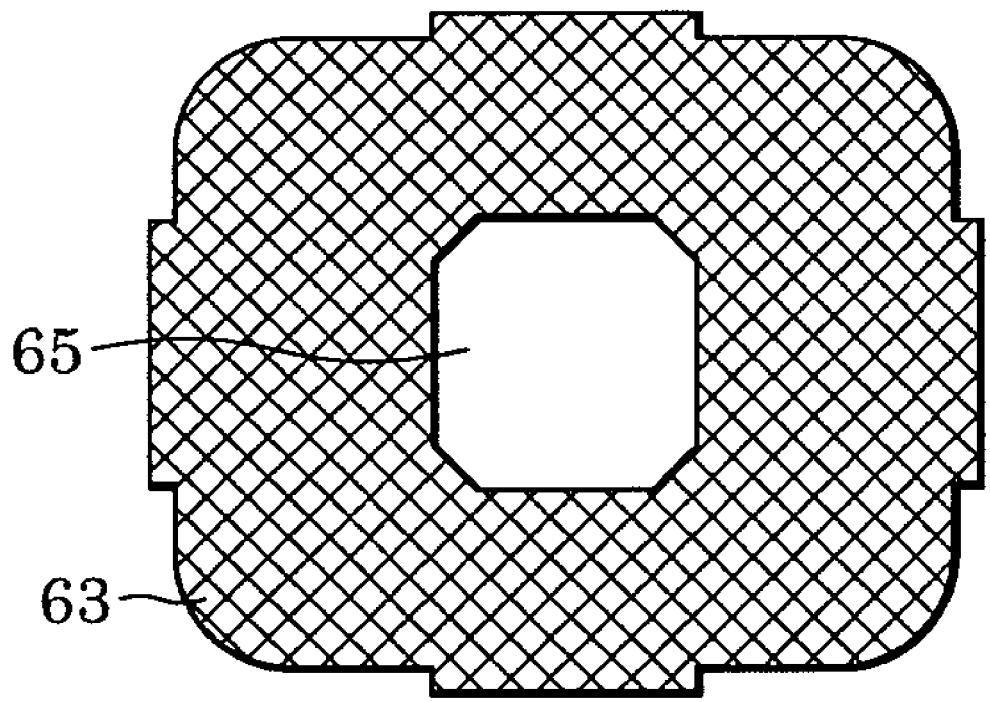
FIG. 17 is a top view of a diaphragm member (second diaphragm member) of the imaging device according to the third embodiment.

FIG. 17 is a top view of a diaphragm member (second diaphragm member) 63. The second diaphragm member 63 serves to prevent light beams passing through an area where the first diaphragm layer 9 is not disposed on the transparent unit 1 from entering the light-receiving area (i.e., to avoid flare and ghosting). The second diaphragm member 63 includes an opening (diaphragm opening) 65 corresponding to a light beam from the lens member 2. A thermosetting adhesive is used as an adhesive portion 64. The second diaphragm member 63 may be formed on the top surface of the dustproof glass 56 by printing or a photolithographic method.

A square area 60 indicated by a dotted line shown in FIG. 16 represents the outer perimeter of the imaging sensor chip 16, and a square area 61 represents the light-receiving area 17. The outer perimeter of the dustproof glass 56 is a little larger than the light-receiving area 17 and smaller than the perimeter of the imaging sensor chip 16. A square area 62 indicated by a dotted line represents the perimeter of the transparent unit 1, and it is larger than that of the dustproof glass 56.

The plate-shape second diaphragm member 63 is disposed on the top surface of the dustproof glass 56. The second diaphragm member 63 is bonded and fixed to the holding unit 5 with the adhesive portion 64.

Figure 18:
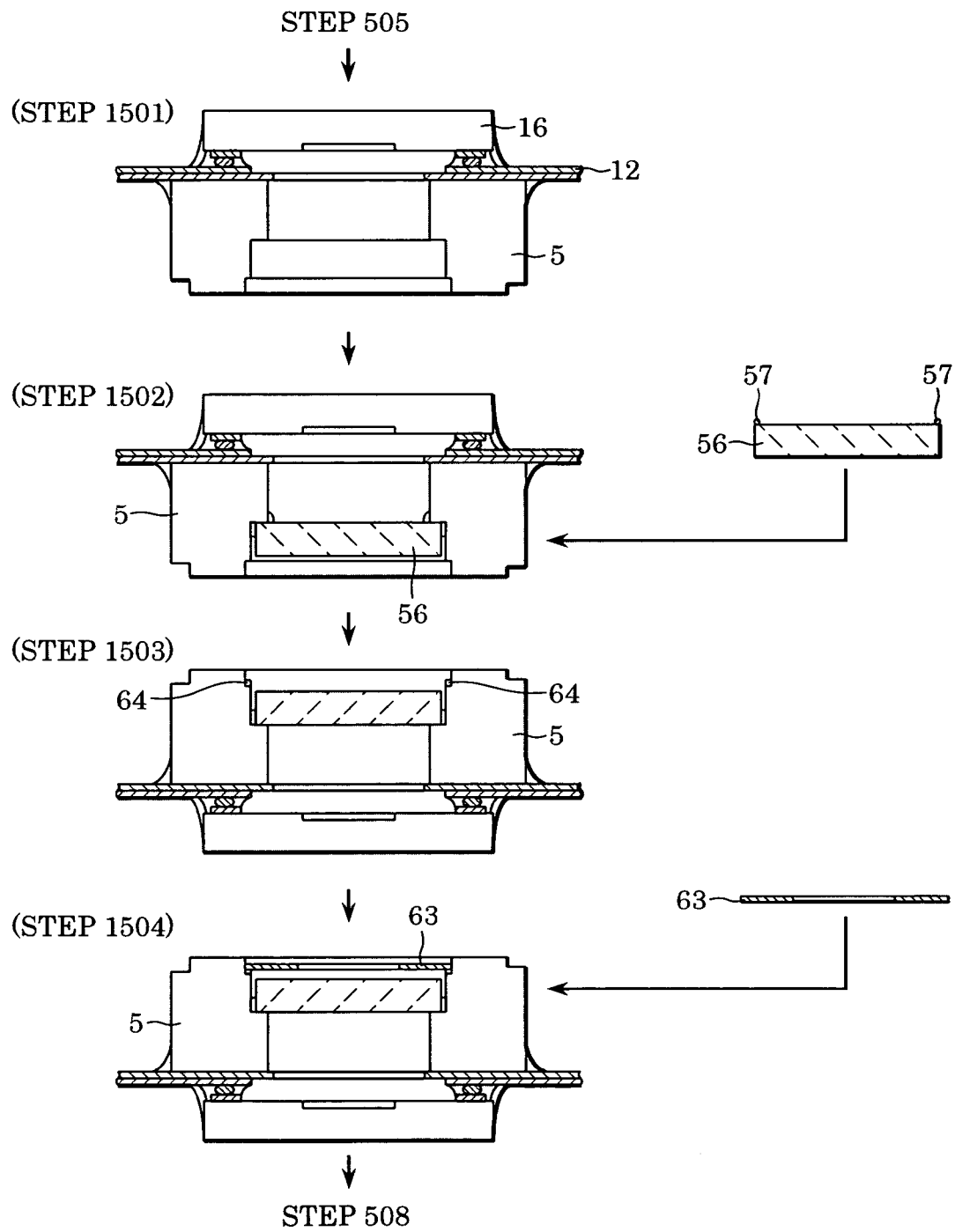
FIG. 18 shows part of the steps for manufacturing the imaging device according to the third embodiment.

The process of manufacturing the imaging device according to the third embodiment is described below with reference to FIG. 18. Steps 501 to 506 shown in FIG. 7 are the same as those in this embodiment, so the explanation is not repeated here.

Step 1501 corresponds to step 506 in FIG. 7. The assembly of the holding unit 5, the flexible wiring board 12, and the imaging sensor chip 16 is completed.

In step 1502, the dustproof glass 56 is bonded and fixed to the holding unit 5. After the adhesive portions 57 are applied to a surface of the dustproof glass 56, the surface being adjacent to the imaging sensor chip 16, by screen printing or a dispense method, the dustproof glass 56 is pressed against the holding unit 5 using a jig. If an ultraviolet curing adhesive is used, the adhesive portions 57 are irradiated with ultraviolet rays from the bottom and cured.

Up to this step 1502, the operation in a clean room is required. The operation of step 1503 and the subsequent steps can be performed under normal conditions.

In step 1503, the adhesive portion 64 for bonding the second diaphragm member 63, which is to be bonded and fixed in the next step, is applied by a dispenser.

In step 1504, the second diaphragm member 63 is pressed against the holding unit 5 using a jig or the like, so that the second diaphragm member 63 is bonded and fixed to the holding unit 5. Since the second diaphragm member 63 is a light-blocking unit, it is difficult to cure the adhesive portion 64 with ultraviolet rays. Therefore, a thermosetting adhesive is used as the adhesive portion 64, as described above. The processing then proceeds to the next step. Since the subsequent steps are the same as steps 508 and 509 in FIG. 5, the explanation is not repeated here.

With the process described above, the imaging device according to the third embodiment is produced. In this embodiment, the operation in a clean room is reduced. Therefore, this embodiment has advantages in that a capital investment is reduced, the imaging device is further miniaturized, and cost reduction is realized, in addition to the advantages of the first and second embodiments. In this embodiment, the flexible wiring board 12 and the imaging sensor chip 16 produced through the step shown in FIG. 10 may be employed.

Fourth Embodiment

In the fourth embodiment, the imaging device including the dustproof glass 56 in the third embodiment is applied to the imaging device including the lens member 32 including the four lens elements in the second embodiment.

In this embodiment, the components having the same functions as those in the first, second, and third embodiments have the same reference numerals, and similar structures are described with reference to the drawings in the first, second, and third embodiments.

Figure 19:
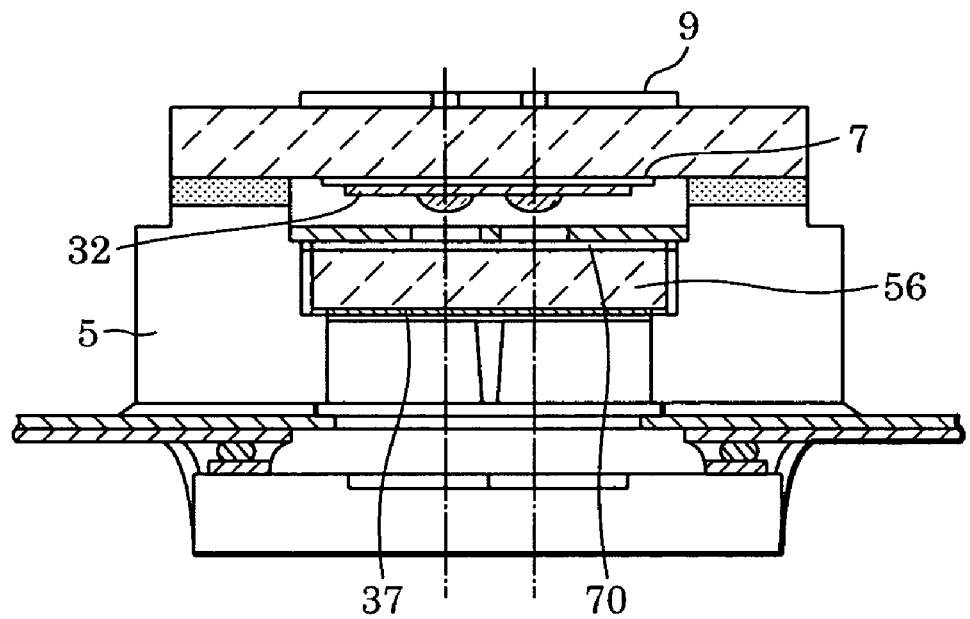
FIG. 19 is a schematic vertical sectional view of the imaging device according to a fourth embodiment.

FIG. 19 is a schematic vertical sectional view of the imaging device according to the fourth embodiment. The dustproof glass 56 and the second diaphragm member 63 are bonded to and held by the holding unit 5. In this embodiment, a color filter layer 37 is disposed on a surface of the dustproof glass 56, the surface being adjacent to the imaging sensor chip 16. As a result, only the lens member 32 including the four lens elements, the infrared cutoff filter 7, and the first diaphragm layer 9 are disposed on the transparent unit 1.

Figure 20:
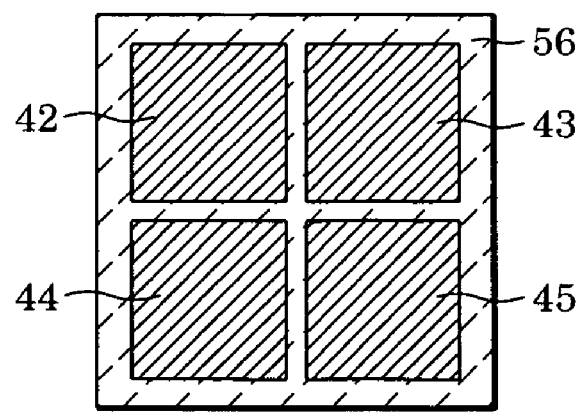
FIG. 20 shows a dustproof glass viewed from the photoelectric conversion element of the imaging device according to the fourth embodiment.

FIG. 20 shows the dustproof glass 56 viewed from the imaging sensor chip 16. The color filters 42, 43, 44, and 45 corresponding to individual specific colors are included. In this embodiment, no unit is formed on the top of the color filter layer 37. In other words, since the color filter layer 37 is disposed on the bottom surface of the dustproof glass 56, planarization is not required, thus realizing cost reduction.

Figure 21:
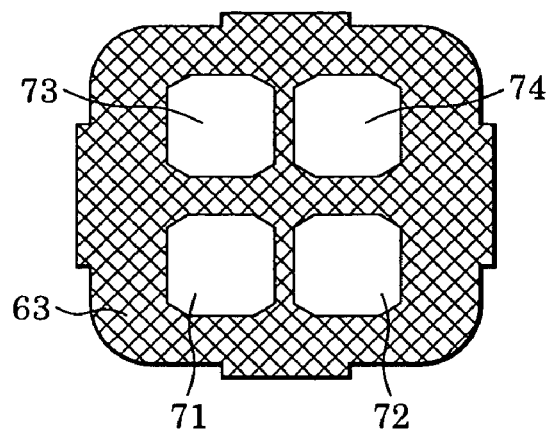
FIG. 21 shows the diaphragm member (second diaphragm member) of the imaging device according to the fourth embodiment.
Figure 22:
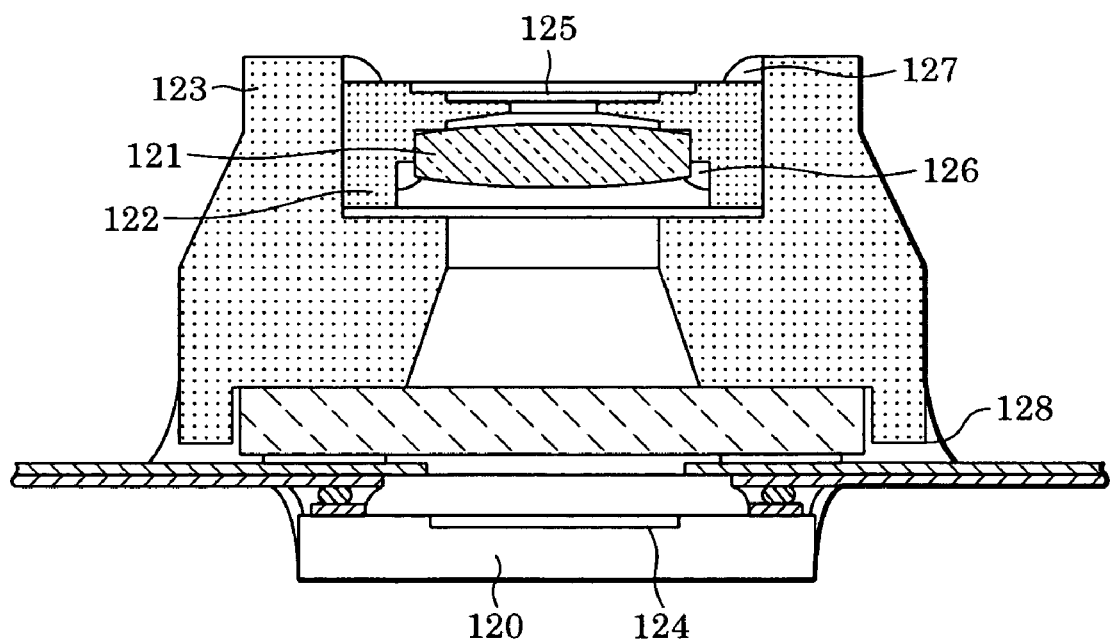
FIG. 22 is a schematic sectional view of a known small imaging device.

FIG. 21 is a top view of the second diaphragm member 63. The second diaphragm member 63 includes four openings (diaphragm openings) 71, 72, 73, and 74 corresponding to the four aspheric portions 33, 34, 35, and 36 of the lens member 32 shown in FIG. 12A, respectively.

The foregoing is distinctive of the fourth embodiment. Other features are the same as those in the other embodiments, so the explanation is not repeated here. The process of manufacturing the imaging device is the same as that in the third embodiment, and the explanation is not repeated here. In this embodiment, the flexible wiring board 12 and the imaging sensor chip 16 produced through the step shown in FIG. 10 may be employed.

As described above, in the imaging device according to the fourth embodiment, the color filter layer 37 is disposed on the dustproof glass 56. In addition to the advantages of the other embodiments, a significant cost reduction is realized.

According to the present invention, since the transparent unit 1 with the lens member and the diaphragm member integrated therein is held by the holding unit, the imaging device has a simple structure, and the number of components is reduced. Therefore, the miniaturized imaging device can be realized.

As many apparently widely different embodiments of the present invention can be made without departing from the spirit and scope thereof, it is to be understood that the invention is not limited to the specific embodiments thereof except as defined in the claims.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-162508 filed May 31, 2004, which is hereby incorporated by reference herein.

What is claimed is:

1. An imaging device comprising:
a transparent unit;
a holding unit configured to hold the transparent unit, the holding unit comprising a ring-shaped protrusion having a top surface that is flat to accommodate the transparent unit thereon, the transparent unit being adhered to the top surface via an adhesive layer;
a photoelectric conversion element configured to photoelectrically convert a light beam passing through the transparent unit;
an electrical wiring board electrically connected to the photoelectric conversion element;
first electrode pads configured to electrically connect the photoelectric conversion element and the electrical wiring board; and
second electrode pads as dummies that are not electrically connected to wiring of the electrical wiring board,
wherein the transparent unit and a lens unit disposed on a first surface of the transparent unit and a diaphragm unit disposed on a second surface of the transparent unit opposite the first surface are integrated,
wherein the transparent unit and the electrical wiring board are integrated via the holding unit, with an upper side of the electrical wiring board being bonded to a lower surface of the holding unit, and
wherein the photoelectric conversion element and the electrical wiring board are bonded to each other with a conductive paste portion via the first electrode pads and the second electrode pads, with a lower side of the electrical wiring board being bonded to an upper side of the photoelectric conversion element.

2. The imaging device according to claim 1 wherein, with respect to a face perpendicular to the optical axis of the lens, the flat surface of the ring-shaped protrusion of the holding unit, and an area where the conductive paste portion is set between the photoelectric conversion element and the electrical wiring board, substantially overlap one another.

* * * * *